United States Patent
Kautzsch

(10) Patent No.: US 9,536,918 B2
(45) Date of Patent: Jan. 3, 2017

(54) INTEGRATED CIRCUIT WITH CAVITY-BASED ELECTRICAL INSULATION OF A PHOTODIODE

(71) Applicant: Infineon Technologies AG, Neubiberg (DE)

(72) Inventor: Thoralf Kautzsch, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/840,371

(22) Filed: Aug. 31, 2015

(65) Prior Publication Data

US 2016/0064431 A1    Mar. 3, 2016

(30) Foreign Application Priority Data

Sep. 1, 2014    (DE) .................. 20 2014 104 087 U

(51) Int. Cl.
*H01L 27/146*    (2006.01)
*H01L 31/0475*    (2014.01)

(52) U.S. Cl.
CPC ..... *H01L 27/1463* (2013.01); *H01L 27/14643* (2013.01); *H01L 31/0475* (2014.12); *Y02E 10/50* (2013.01)

(58) Field of Classification Search
CPC .............. H01L 27/14643; H01L 27/76224; H01L 2924/12043; H01L 27/1463
See application file for complete search history.

(56) References Cited

U.S. PATENT DOCUMENTS

| | | | |
|---|---|---|---|
| 5,757,057 A * | 5/1998 | Dabrowski | H01L 27/14643 257/438 |
| 2004/0021633 A1* | 2/2004 | Rajkowski | G06F 3/0233 345/156 |
| 2006/0060932 A1* | 3/2006 | Rafferty | H01L 27/14649 257/436 |
| 2007/0141809 A1* | 6/2007 | Ponza | H01L 21/78 438/460 |
| 2012/0242876 A1* | 9/2012 | Hagiwara | H01L 27/14618 348/294 |
| 2013/0062502 A1* | 3/2013 | Kautzsch | H01L 31/062 250/206 |

\* cited by examiner

*Primary Examiner* — Khiem D Nguyen
(74) *Attorney, Agent, or Firm* — Eschweiler & Associates, LLC

(57) ABSTRACT

An integrated circuit includes a semiconductor substrate, at least one photodiode, which is formed on a surface of the semiconductor substrate, at least one trench, which extends from the surface of the semiconductor substrate into the semiconductor substrate and surrounds a region of the semiconductor substrate on which the photodiode Is arranged, and at least one cavity in the semiconductor substrate, which is located below the surface of the semiconductor substrate. The at least one trench and the at least one cavity form an electrical insulation structure between the region of the semiconductor substrate on which the photodiode is arranged and one or more adjacent regions of the semiconductor substrate.

15 Claims, 7 Drawing Sheets

INTEGRATED CIRCUIT WITH CAVITY-BASED ELECTRICAL INSULATION OF A PHOTODIODE

CROSS REFERENCE TO RELATED APPLICATIONS

This application claims priority to German Application No. 202014104087.0, filed on Sep. 1, 2014, and incorporated herein by reference in its entirety.

FIELD

The present application relates to integrated circuits with one or more photodiodes.

BACKGROUND

It is known to use photodiodes as photocells for supplying energy to integrated circuits. The photodiodes can be provided, for example, in the form of an external module via which the integrated circuit is supplied with electrical energy. In order to achieve the supply voltage which is necessary for a typical integrated circuit, series circuits of photodiodes can be used, for example.

However, for many areas of application, for example integrated circuits for implementing an autonomous sensor device, a highly integrated and thus compact design is important, with the result that an energy supply via an external module is not desirable. Integration of series-connected photodiodes on the semiconductor substrate of an integrated circuit is connected with considerable expense, however.

SUMMARY

A problem addressed by the present disclosure includes providing technologies by means of which an efficient implementation of an integrated circuit with one or more photodiodes is made possible.

According to the present disclosure, an integrated circuit is provided.

According to an embodiment of the disclosure, an integrated circuit is thus provided. The integrated circuit comprises a monocrystalline semiconductor substrate, in particular a monocrystalline silicon substrate. At least one photodiode is formed on a surface of the semiconductor substrate. A trench extends from the surface of the semiconductor substrate into the semiconductor substrate and surrounds a region of the semiconductor substrate. The photodiode is arranged on this region. Furthermore, at least one cavity is provided in the semiconductor substrate. The at least one cavity is located below the surface of the semiconductor substrate, in particular below the region on which the photodiode is arranged. In some embodiments, the at least one cavity may comprise a multiplicity of tubular cavities arranged next to one another. The at least one trench and the at least one cavity form an electrical insulation means between the region of the semiconductor substrate on which the photodiode is arranged and one or more adjacent regions of the semiconductor substrate, for example adjacent regions on which further photodiodes are arranged. The at least one photodiode can thus be electrically insulated on the substrate side from the further regions of the semiconductor substrate in a simple manner.

According to one embodiment, the at least one trench is filled with a dielectric material.

The at least one cavity may be formed by a process which comprises producing trenches which lie next to one another in the surface of the semiconductor substrate, and heat-treating the semiconductor substrate, with the result that the surface of the semiconductor substrate closes over the trenches.

If the semiconductor substrate is a silicon substrate, the process of forming the at least one cavity may be, for example, an SON process (SON: "silicon on nothing").

According to an embodiment, the integrated circuit comprises a multiplicity of photodiodes, which are formed on the surface of the semiconductor substrate. In this case, the at least one trench may surround a region of the semiconductor substrate on which the photodiode is arranged for each of the photodiodes. The at least one trench and the at least one cavity then form an electrical insulation means between the regions of the semiconductor substrate on which the photodiodes are each arranged. The photodiodes can thus be electrically insulated from one another on the substrate side in a simple manner.

According to an embodiment, at least some of the photodiodes are connected in series. Owing to the electrical insulation on the substrate side, this can be achieved in a simple manner via corresponding circuit structures on the surface of the semiconductor substrate. By way of example, the photodiodes may be identical in size.

According to an embodiment, the integrated circuit may be configured to be supplied with energy via the at least one photodiode. Furthermore, the integrated circuit may comprise an energy buffer and a supply circuit, which is configured to charge the energy buffer via the at least one photodiode.

According to an embodiment, the integrated circuit comprises at least one sensor circuit. The at least one sensor circuit may be configured to perform pressure measurements, acceleration measurements and/or temperature measurements. Furthermore, the integrated circuit may also comprise at least one data processing circuit, at least one data memory circuit and/or at least one data transmission circuit. The integrated circuit can thus be configured for compact implementation of an autonomous sensor device.

Further details of the stated example embodiments and further example embodiments are described below with reference to the appended drawings.

DETAILED DESCRIPTION

Example embodiments of the present disclosure are explained in more detail below with reference to the appended drawings. In this connection, it goes without saying that the illustrated example embodiments are intended to be merely an illustration of possible implementations of the disclosure and not to be understood as a restriction thereon. In particular, features of different example embodiments may be combined with one another. Furthermore, a description of an example embodiment with a multiplicity of features is not to be interpreted to the effect that all of the features are necessary to implement the disclosure. By way of example, other example embodiments could have fewer features and/or alternative features.

Example embodiments illustrated below relate to an integrated circuit which has at least one photodiode. A part of the integrated circuit 100 is illustrated by way of example in FIG. 1.

Figure 1:
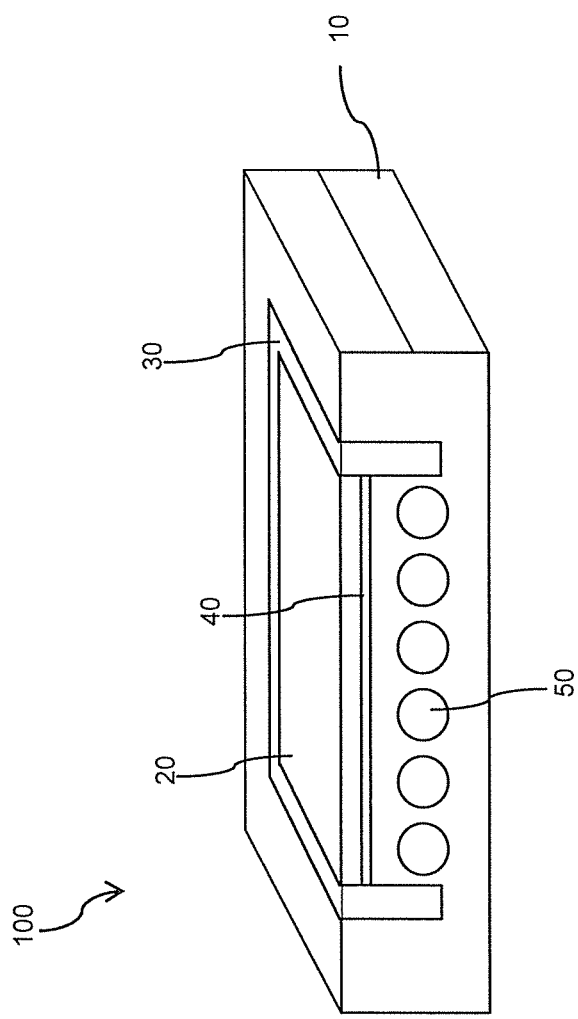
FIG. 1 schematically illustrates a part of an integrated circuit according to an example embodiment of the disclosure.

As can be seen in FIG. 1, the photodiode 20 is formed on a surface of a monocrystalline semiconductor substrate 10. The semiconductor substrate 10 may be, in particular, a silicon substrate. An arrangement of a plurality of closely adjacent cavities 50 is formed below the surface of the semiconductor substrate 10. Alternatively, the adjacent cavities 50 could also be replaced by a single cohesive cavity. A region of the surface on which the photodiode 20 is located is surrounded by a trench 30. The trench 30 extends from the surface of the semiconductor substrate 10 to the cavities 50, with the result that the trench 30 forms, together with the cavities 50, an electrical insulation structure between the region on which the photodiode 20 is formed and adjacent regions of the semiconductor substrate 10. Specifically, in this way, electrical insulation between a doping layer 40 of the photodiode 20 and the adjacent regions of the semiconductor substrate 10 can be provided. This enables efficient production of the photodiode 20 and simplified integration of the photodiode 20 with other electronic circuit elements which are formed on the surface of the semiconductor substrate 10. By way of example, the photodiode 20, the doping layer 40, contacts of the photodiode 20 (not illustrated in FIG. 1), the trench 30 and other circuit elements which are coupled to the photodiode 20 can be produced together using conventional CMOS processes (for example lithography, deposition, implantation and etching). Expensive provision of a rear-side electrical insulation structure is not necessary owing to the cavities 50.

Figure 2:
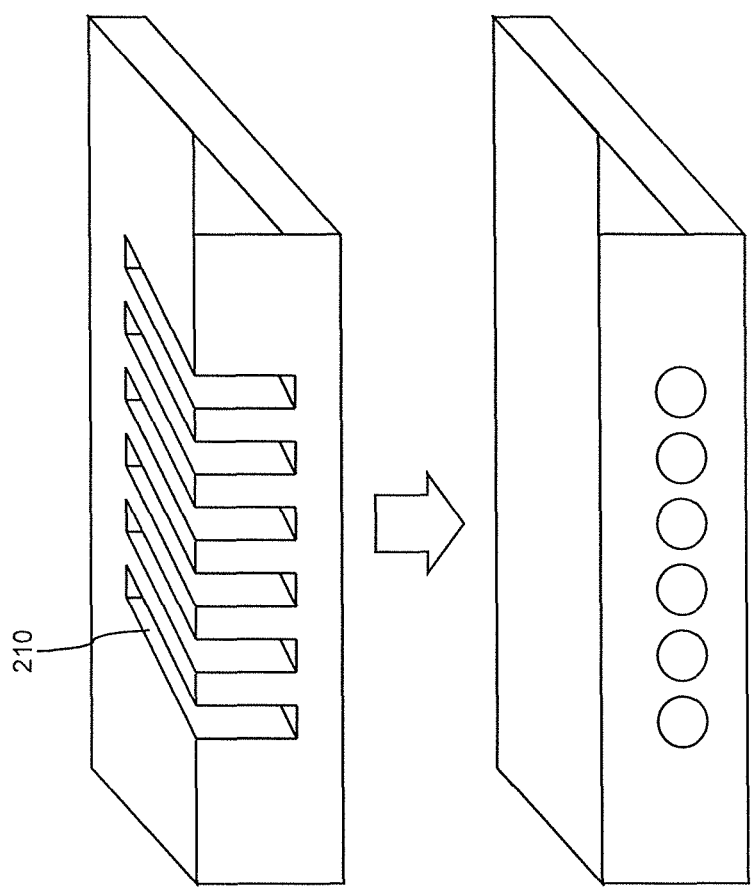
FIG. 2 schematically illustrates the formation of cavities, which are used according to an example embodiment of the disclosure, in a semiconductor substrate.

FIG. 2 schematically illustrates the formation of the cavities 50. As illustrated, the cavities 50 can be formed by parallel trenches 210, which extend from the surface of the semiconductor substrate to a depth which substantially corresponds to the desired position of the cavities 50 below the surface of the semiconductor substrate 10, firstly being formed in the semiconductor substrate 10. By way of example, the trenches 210 may be lithographically defined and subsequently formed by an etching process.

Subsequently, the semiconductor substrate 10 undergoes heat treatment which causes the surface of the semiconductor substrate 10 to close again, with the result that the cavities 50 are formed and are completely embedded in the material of the semiconductor substrate 10. By selecting process parameters, for example depth of the trenches 210, width of the trenches 210, distance between the trenches 210, duration of the heat treatment, temperature of the heat treatment and the like, the geometry of the resulting tubular cavities 50 can be influenced. What can also be achieved by suitable selection of the process parameters is that the tubular cavities 50 which initially lie next to one another unite to form a larger flat cavity.

The cavities 50 act as an electrically insulating layer. This is to be ascribed, firstly, to the fact that no potentially conductive semiconductor material is located in the cavities 50. Furthermore, an electrically insulating passivation layer usually forms on the inner surface of the cavities 50, which passivation layer also effects electrically insulating properties of the material between the cavities 50 in the case of sufficiently narrow spacing between adjacent cavities 50.

In the event that a silicon substrate is used as the semiconductor substrate 10, the cavities 50 can be produced using an SON process. Details relating to such an SON process are found, for example, in "Fabrication of Silicon-on-Nothing Structure by Substrate Engineering . . . ", Sato et al., Japanese Journal of Applied Physics, Vol. 43, No. 1, 2004, pages 12-18, which is hereby incorporated by reference in its entirety.

Figure 3:
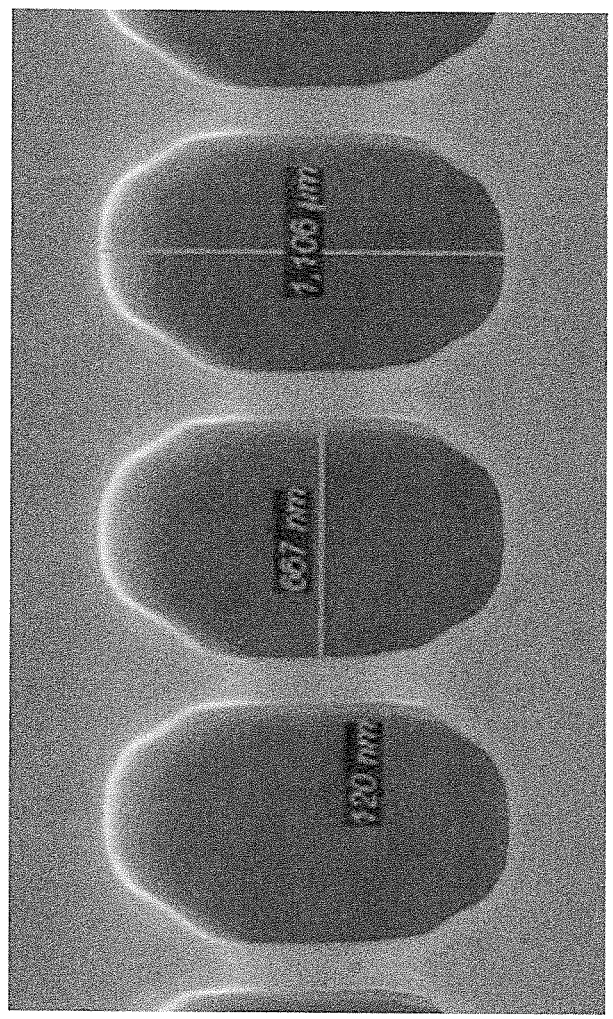
FIG. 3 shows a scanning electron microscope capture of a photodiode according to an example embodiment of the disclosure.

FIG. 3 shows a scanning electron microscopic cross-sectional capture of tubular cavities formed using an SON process, by means of which the cavities 50 can be implemented. It can be seen that the cavities have a tubular geometry with a height in the region of 1 µm and a width in the region of 0.5 µm. The spacing between adjacent cavities is in the region of 0.1 µm. However, depending on the selected process parameters, deviating geometries are also possible, for example height in the range from 0.5 to 2 µm, widths in the range from 0.2 µm to 1 µm and spacings in the range from 0 to 0.2 µm. Furthermore, the passivation layer formed on the inner surfaces of the cavities can also be seen in FIG. 3 as the lighter area. In the case of the illustrated example, the passivation layer has a thickness of approximately 0.07 µm.

Figure 4:
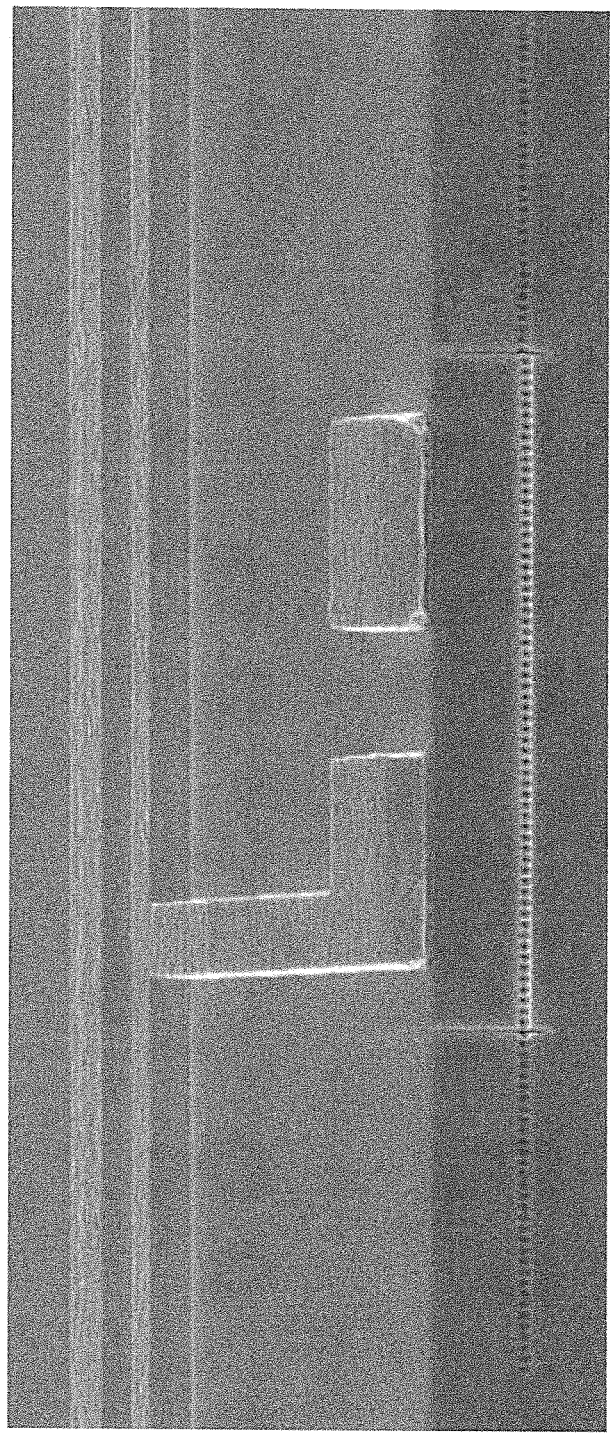
FIG. 4 shows a scanning electron microscope capture of cavities, used according to an example embodiment of the disclosure, in a semiconductor substrate.

FIG. 4 shows another scanning electron capture on which a photodiode as described above is depicted. In particular, the electrical insulation means formed around the region of the photodiode by means of the trench and the cavities can be seen in the image. Furthermore, FIG. 4 shows contacts of the photodiode, which are formed on the surface of the semiconductor substrate.

Figure 5:
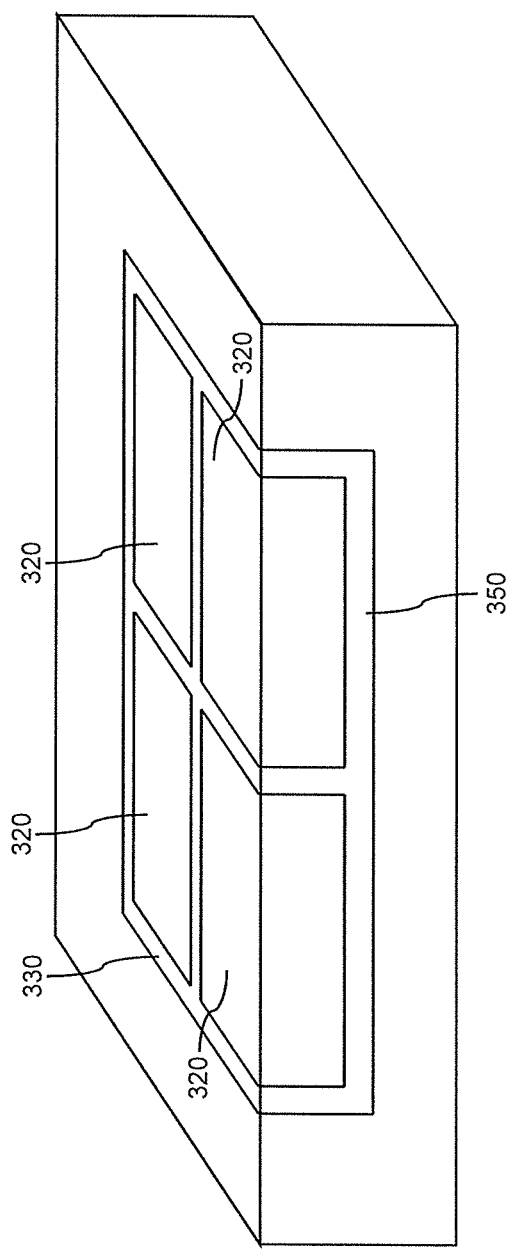
FIG. 5 illustrates an arrangement of a plurality of photodiodes according to an example embodiment of the disclosure.

FIG. 5 shows an example arrangement in which a plurality of photodiodes 320 are formed adjacent to one another on the semiconductor substrate. As explained above, there is at least one cavity 350 or an arrangement of a plurality of adjacent cavities 350 below the photodiodes 320. A trench 330 surrounds the region of the semiconductor substrate on which the photodiodes 320 are formed and extends from the surface of the semiconductor substrate to the cavity 350 or the cavities 350. Furthermore, the trench 330 also extends between the regions of the surface on which the individual photodiodes 320 are each formed, that is to say the trench 330 separates the photodiodes 320 from one another. The trench 330 and the cavity 350 or the cavities 350 thus form an electrical insulation means not only between the regions of the semiconductor substrate on which the photodiodes 320 are formed and the rest of the semiconductor substrate, but also between the respective subregions on which the individual photodiodes 320 are each formed.

An arrangement of a plurality of photodiodes 320 as illustrated in FIG. 5 enables an efficient connection in series of the photodiodes 320 via contacts on the surface of the semiconductor substrate, for example using conventional CMOS processes. Rear-side short-circuiting of the individual photodiodes 320 via the semiconductor substrate is avoided. Series connection of a plurality of identically sized photodiodes in turn enables efficient scaling of a total output voltage which can be obtained via the series-connected photodiodes 320. Thus, for example, ten photodiodes can be connected in series, which enables a maximum output voltage of 5 V in the case of a maximum individual output voltage of 0.5 V which is typical for silicon photodiodes. The series connection of the photodiodes enables simple scaling to achieve different total output voltages in the range of 1 V, as is often required as supply voltage for pure logic circuits, to 15 V, as is often required for non-volatile memory circuits based on flash technology, or 20 V, as is often required for light sources of optical data transmission circuits. However, it goes without saying that higher total output voltages can also be provided. Furthermore, different output voltages can also be provided at the same time by taps between the series-connected photodiodes, for example 1 V for pure logic circuits, 5 V for data transmission circuits and 15 V for memory circuits.

Figure 6:
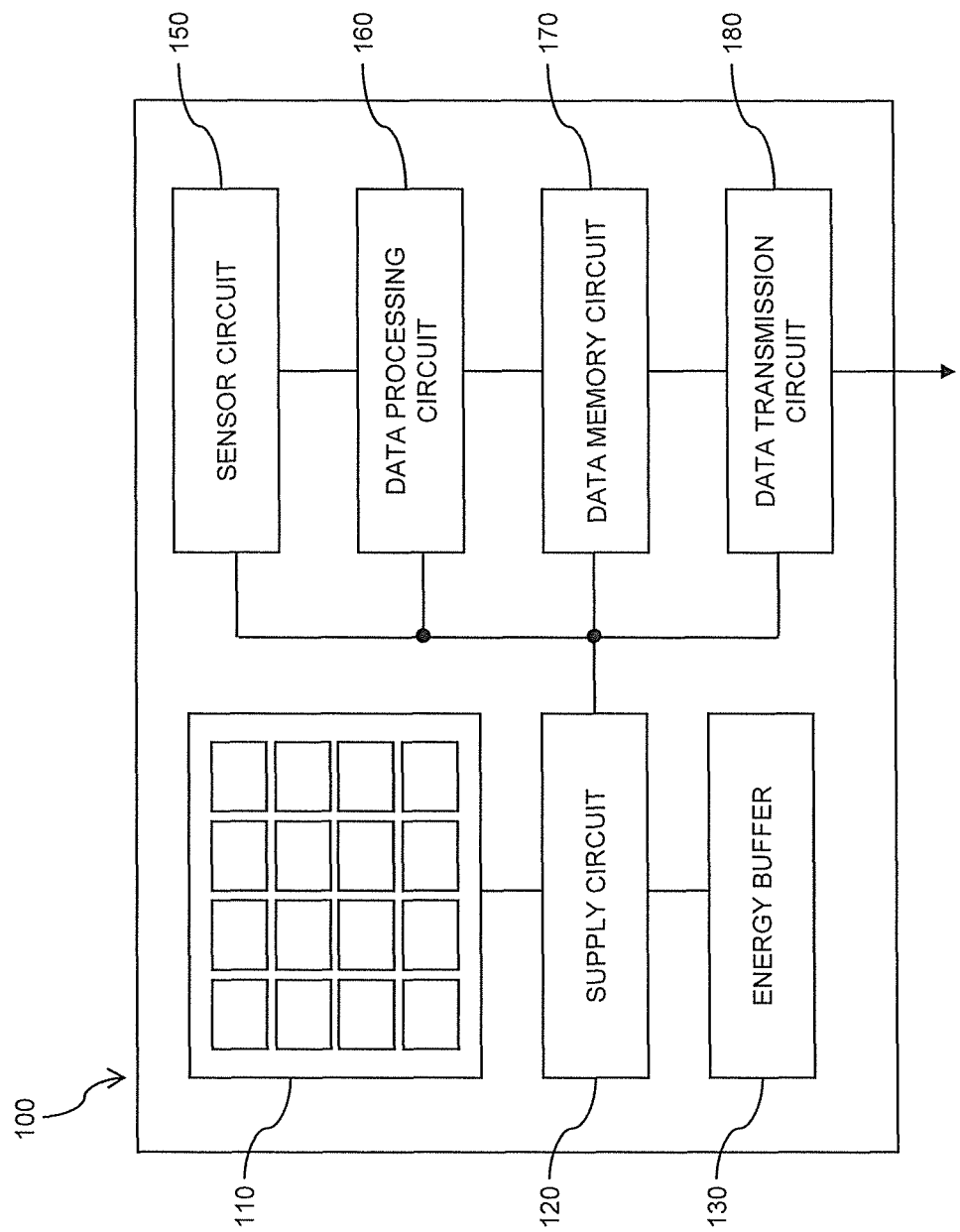
FIG. 6 shows a block diagram to illustrate an integrated circuit according to an example embodiment of the disclosure.

FIG. 6 shows a block diagram to illustrate an example implementation of the integrated circuit 100. The integrated circuit 100 is configured to be supplied with energy via an arrangement 110 of photodiodes formed as described above. In the case of the arrangement 110, a plurality of the photodiodes can be connected in series, with the result that efficient scaling of the supplied supply voltage or supply voltages can be achieved. Moreover, a supplied supply current can also be efficiently scaled by connecting the photodiodes in parallel.

As illustrated in FIG. 6, the integrated circuit 100 in this implementation has a supply circuit 120 and an energy buffer 130. The energy buffer 130 may be implemented, for example, on the basis of a capacitor and/or a rechargeable electrochemical battery.

The supply circuit 120 is configured to charge the energy buffer 130 with the output voltage supplied by the arrangement 110 of photodiodes. In this connection, the supply circuit 120 can differentiate, for example, between phases in which the photodiodes are in darkness and thus supply no energy and phases in which the photodiodes are illuminated and thus supply energy. In the latter phases, the energy buffer 130 can be charged. Furthermore, the energy obtained can also be used to directly supply the integrated circuit 100. In the former phases, the supply circuit 120 can again use the energy stored in the energy buffer 130 to supply the integrated circuit 100.

As also shown in FIG. 6, the integrated circuit can also be provided with various other circuits, for example a sensor circuit 150, a data processing circuit 160, a data memory circuit 170 and/or a data transmission circuit 180, according to the area of application. As illustrated, these circuits are supplied by the supply circuit 120 with the energy obtained from the photodiodes. For this purpose, the supply circuit 120 can also provide various supply voltages adapted to the respective circuits.

The sensor circuit 150 can be configured, by way of example, to perform pressure measurements, acceleration measurements and/or temperature measurements. The sensor circuit 150 can supply data obtained from the performed measurements to the data processing circuit 160. The data processing circuit 160 can then prepare the obtained data, for example by filtering or statistical evaluation. The obtained data or the prepared data can be forwarded for storage to the data memory circuit 170 which can be implemented on the basis of flash technology, for example. Furthermore, the obtained data or the prepared data can be forwarded for transmission to the data transmission circuit 180. The data transmission circuit 180 can be configured on the basis of a wireless transmission technology, for example a radio technology such as WLAN (wireless local area network) or Bluetooth, or an optical transmission technology such as IrDA (infrared data access) in order to transmit the data. Alternatively or in addition, the data transmission circuit 180 can also be based on a wired transmission technology, for example USB (universal serial bus) or Ethernet. It goes without saying that a unidirectional data transmission, for example from the data transmission circuit 180 to a receiver, or a bidirectional data transmission can be provided depending on the application requirements.

The construction of the integrated circuit 100 illustrated in FIG. 6 can advantageously be used to implement an autonomous sensor device with a compact design. However, other areas of application are likewise possible, wherein it goes without saying that more or variant circuits can be provided depending on the respective application requirements. Furthermore, it goes without saying that one or more of the circuits illustrated in FIG. 6 can be omitted depending on the application requirements.

Figure 7:
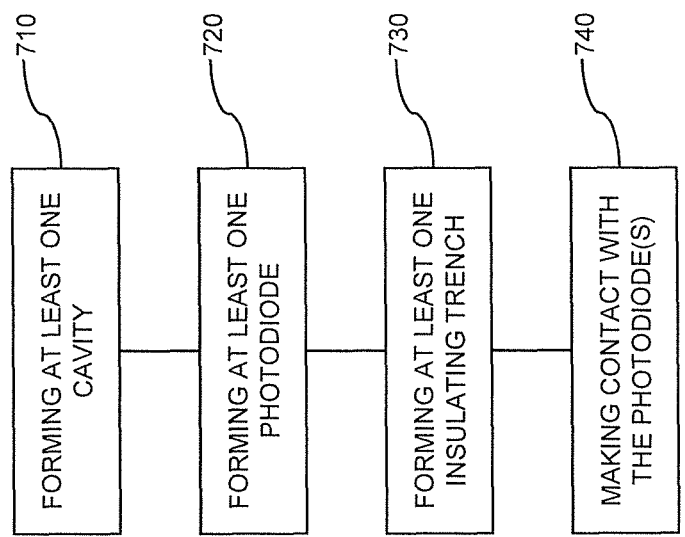
FIG. 7 shows a flow chart to illustrate processes for producing an integrated circuit according to an example embodiment of the disclosure.

FIG. 7 shows a flow chart to illustrate a method for producing an integrated circuit, for example the integrated circuit 100 described above.

At 710, at least one cavity is formed in a monocrystalline semiconductor substrate. By way of example, act 710 can comprise forming the cavities 50 or 350 in the semiconductor substrate 10.

The at least one cavity can be formed by a process in which, firstly, trenches which lie next to one another are produced in the surface of the semiconductor substrate and then the semiconductor substrate is heat-treated, with the result that the surface of the semiconductor substrate closes over the trenches, as was explained, for example, in connection with FIG. 2.

The semiconductor substrate can be a silicon substrate. The at least one cavity can then be formed by an SON process.

At 720, at least one photodiode is formed on a surface of the semiconductor substrate. This can comprise, for example, implantation of a doping layer close to the surface of the semiconductor substrate. The at least one photodiode is formed in a region of the surface below which the at least one cavity is located. By way of example, act 720 can comprise forming the photodiodes 20 or 320 on the semiconductor substrate 10.

At 730, at least one trench is formed. The trench extends around the region of the surface of the semiconductor substrate on which the at least one photodiode is formed. In addition, the at least one trench extends starting from the surface of the semiconductor substrate to the at least one cavity. The at least one trench and the at least one cavity form an electrical insulation means between the region of the semiconductor substrate on which the photodiode is formed and adjacent regions of the semiconductor substrate. The trench can be filled with a dielectric material. By way of example, act 730 can comprise forming the trench 30 or 330 in the semiconductor substrate 10.

At 740, contact can be made with the at least one photodiode. This can be done using conventional CMOS processes, beginning with the surface of the semiconductor substrate. In this connection, further circuit elements can also be formed on the surface of the semiconductor substrate. If a plurality of photodiodes have been formed, which are insulated from one another by the at least one cavity and the at least one trench, in this connection said photodiodes can also be connected in series.

It goes without saying that, in the case of the method of FIG. 7, a variant sequence of the illustrated steps is possible. By way of example, the formation of the photodiode(s) at 720 could take place after the formation of the trench at 730.

Furthermore, it goes without saying that various modifications are possible in the case of the illustrated example embodiments without deviating from the basic idea of the illustrated concepts. By way of example, the illustrated concepts could be used in conjunction with different semiconductor materials, that is to say they are not restricted to the use of silicon. Furthermore, the photodiodes could be used for purposes other than obtaining energy. Moreover, various other applications are possible in addition to the illustrated applications of the integrated circuit.

The invention claimed is:

1. An integrated circuit, comprising:
a semiconductor substrate;
a plurality of photodiodes, which are formed on a surface of the semiconductor substrate;
a plurality of trenches, which extend from the surface of the semiconductor substrate into the semiconductor substrate and surround regions of the semiconductor substrate on which the photodiodes are arranged for each of the plurality of photodiodes;
at least one cavity in the semiconductor substrate, which is located below the surface of the semiconductor substrate,
wherein the trenches and the at least one cavity form an electrical insulation structure between the regions of the semiconductor substrate on which the photodiodes are each arranged and one or more adjacent regions of the semiconductor substrate,
an energy buffer; and
a supply circuit, which is configured to charge the energy buffer via the plurality of photodiodes,
wherein the integrated circuit is configured to be supplied with energy via the plurality of photodiodes,
wherein the supply circuit is configured to differentiate a first phase in which the plurality of photodiodes are in a first state being illuminated by less than a first predetermined level of light and a second phase in which the plurality of photodiodes are in a second state being illuminated by greater than a second predetermined level of light, and
wherein in the first phase the supply circuit supplies energy to one or more devices of the integrated circuit from the energy buffer, and wherein in the second phase the supply circuit supplies energy to the one or more devices from the plurality of photodiodes, and charges the energy buffer.

2. The integrated circuit as claimed in claim 1, wherein each of the plurality of trenches is filled at least partially with a dielectric material.

3. The integrated circuit as claimed in claim 1, wherein the at least one cavity comprises a multiplicity of tubular cavities arranged next to one another.

4. The integrated circuit as claimed in claim 1, wherein the at least one cavity is formed by a process which comprises:
producing trenches which lie next to one another in the surface of the semiconductor substrate, and
heat-treating the semiconductor substrate after producing the trenches, with the result that the surface of the semiconductor substrate closes over the trenches.

5. The integrated circuit as claimed in claim 1, wherein at least some of the photodiodes are connected in series.

6. The integrated circuit as claimed in claim 1, wherein the photodiodes are identical in size.

7. The integrated circuit as claimed in claim 1, further comprising:
at least one sensor circuit.

8. The integrated circuit as claimed in claim 7, wherein the at least one sensor circuit is configured to perform pressure measurements, acceleration measurements and/or temperature measurements.

9. The integrated circuit as claimed in claim 1, further comprising: at least one data processing circuit.

10. The integrated circuit as claimed in claim 1, comprising at least one data memory circuit.

11. The integrated circuit as claimed in claim 1, comprising at least one data transmission circuit.

12. The integrated circuit as claimed in claim 1, wherein the semiconductor substrate is a silicon substrate.

13. The integrated circuit as claimed in claim 1, wherein the first predetermined level of light and the second predetermined level of light are the same.

14. The integrated circuit as claimed in claim 1, wherein the supply circuit is configured to selectively couple a number of the plurality of photodiodes in series to generate a particular one of a plurality of available supply voltage values, to thereby selectively scale a supply voltage provided by the plurality of photodiodes.

15. The integrated circuit as claimed in claim 1, wherein the supply circuit is configured to selectively couple a number of the plurality of photodiodes in parallel to generate a particular one of a plurality of available supply current values, to thereby selectively scale a supply current provided by the plurality of photodiodes.

* * * * *